United States Patent [19]

Hirano

[11] 4,298,879
[45] Nov. 3, 1981

[54] FIELD EFFECT TRANSISTOR

[75] Inventor: Yutaka Hirano, Atsugi, Japan

[73] Assignee: Fujitsu Limited, Kawasaki, Japan

[21] Appl. No.: 118,225

[22] Filed: Feb. 4, 1980

[30] Foreign Application Priority Data

Feb. 9, 1979 [JP] Japan .................................. 54-14099

[51] Int. Cl.³ ............................................ H01L 29/80
[52] U.S. Cl. ......................................... 357/22; 357/68
[58] Field of Search ........................ 357/22, 35, 36, 68

[56] References Cited

U.S. PATENT DOCUMENTS 3,969,745 7/1976 Blocker ................................. 357/22

OTHER PUBLICATIONS

Fukuta et al., "GaAs Microwave Power FET", *IEEE Transactions on Electron Devices*, vol. Ed-23, No. 4, Apr. 1976, pp. 388-394.
Liechti, "Microwave Field-Effect Transistors-1976", *IEEE Transactions on Microwave Theory and Techniques*, vol. MTT-24, No. 6, Jun. 1976, pp. 279-300.

*Primary Examiner*—R. A. Rosenberger
*Attorney, Agent, or Firm*—Staas & Halsey

[57] ABSTRACT

In a field effect transistor having interdigital electrodes the gate bonding pad portion is situated in the space formed between a pair of adjacent divided portions of the active region of the field effect transistor.

5 Claims, 8 Drawing Figures

FIELD EFFECT TRANSISTOR

BACKGROUND OF THE INVENTION

1. Field of the Invention

The present invention relates to a structure of a bonding pad portion of a gate electrode of a microwave power field effect transistor (FET).

2. Description of the Prior Art

A prior art arrangement of electrodes of a microwave power FET is illustrated in FIGS. 1, 2, 3 and 4. This FET is made of GaAs and is used for high frequency amplification or oscillation in such a range as 4 GHz to 18 GHz. On the surface of the semiconductor chip SC of the FET illustrated in FIG. 1, there are provided a source electrode 2 having finger portions 201, 202, 203, 204, 205 and 206 and a source contact portion 21, a drain electrode 3 having finger portions 301, 302, 303, 304 and 305 and a drain contact portion 31 and a gate electrode 4 having portions 401, 402, 403, 404, 405, 406, 407, 408, 409 and 410 and a gate bonding pad portion 41'.

The cross sections taken along the lines II—II, III—III and IV—IV of FIG. 1 are illustrated in FIGS. 2, 3 and 4, respectively. The cross-sectional structure of the FET of FIG. 1 comprises a semi-insulating monocrystalline substrate 11, a semi-insulating buffer layer 12, an n type active layer 13 and an insulation layer 14 of silicon dioxide. The end of the insulation layer is designated by 14a.

The interdigital structure of the electrodes illustrated in FIG. 1 is adopted in order to increase the width of the gate electrode and simultaneously decrease the resistance of the gate electrode of the FET.

An example of such a prior art structure of an FET is disclosed in a publication "GaAs Microwave Power FET" by M. Fukuta et al, in IEEE Transactions on Electron Devices, Vol. ED-23, No. 4, April 1976.

In the structure of the FET illustrated in FIG. 1, the source electrode is usually connected to a ground bus through an L-shaped sheet made of conductive material such as gold, and the connection to said L-shaped sheet is formed by a gold-tin solder. This is because the above described FET is usually used in a common source configuration and in such a case it is necessary to reduce the source inductance by connecting a large area of the source electrode to the ground bus through the shortest distance.

In the above described structure in which the source electrode is connected to the ground bus, it is also necessary to reduce the distance between the end portion 211 of the source electrode, where the soldering to the ground bus is effected, and the active portion 1 of the FET. However, in the prior art structure illustrated in FIG. 1 it is difficult to reduce said distance between the end portion 211 and the active portion 1 below 250 μm because of the existence of the gate bonding pad 41'. Thus, in the prior art structure it is difficult to reduce the source inductance, and accordingly it is difficult to obtain a large valve of the maximum available gain of the FET. For example, only a maximum available gain of 1 dB in 8 GHz is obtained by a prior art high power FET having a gate width of 20 mm. Although it is desired to reduce the inductance of the bus from the active source area to ground, especially in a large gate width FET in order to increase maximum available gain of the FET, it has been difficult to get the inductance smaller than 40 pH.

SUMMARY OF THE INVENTION

It is the principal object of the present invention to reduce the inductance of an electrode of a microwave power FET connected to an earth bus by reducing the distance between the end portion of the electrode connected to the ground bus and the active portion of the FET so that the maximum available gain of the FET is increased.

In accordance with the present invention, a structure of the FET is provided in which the active region of the field effect transistor is divided into plural portions, and at least a portion of the gate bonding pad portion is situated in the space formed between a pair of adjacent ones of said divided portions of the active region of the field effect transistor.

DESCRIPTION OF THE PREFERRED EMBODIMENTS

Figure 5:
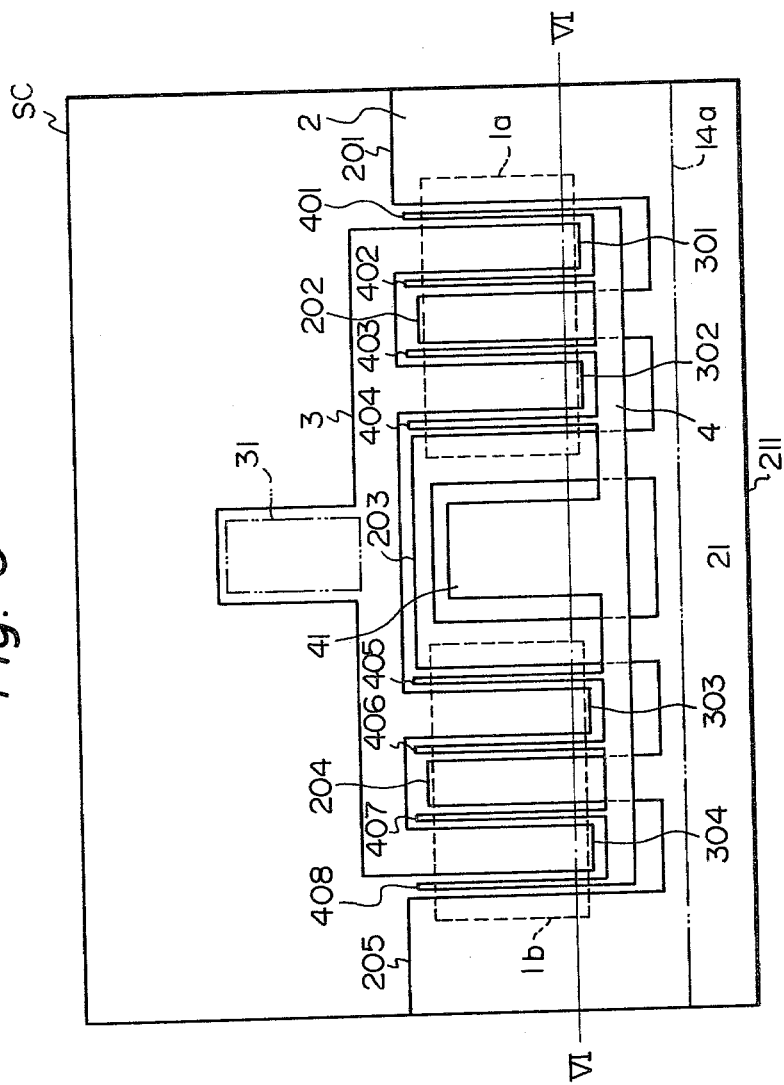
FIG. 5 is a plan view of an FET as an embodiment of the present invention.

The arrangement of the electrode of an FET in accordance with an embodiment of the present invention is illustrated in FIG. 5. On the surface of the semiconductor chip SC of the FET illustrated in FIG. 5, there are provided a source electrode 2 having finger portions 201, 202, 203, 204 and 205 and a source contact portion 21, a drain electrode 3 having finger portions 301, 302, 303 and 304 and a drain bonding pad portion 31 and a gate electrode 4 having portions 401, 402, 403, 404, 405, 406, 407 and 408 and a gate bonding pad portion 41.

Figure 6:
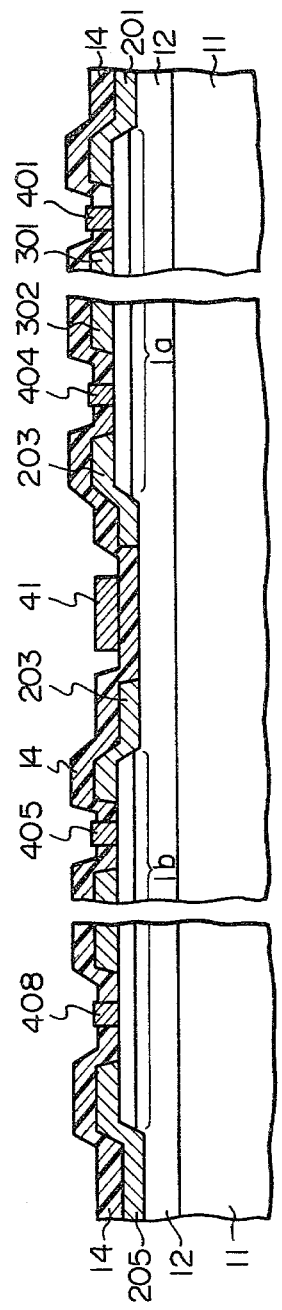
FIG. 6 is a cross-sectional view taken along a line VI—VI of FIG. 5.

The cross-section taken along a line VI—VI of FIG. 5 is illustrated in FIG. 6. The cross-sectional structure of the FET of FIG. 5 comprises a semi-insulating monocrystalline GaAs substrate 11, a semi-insulating GaAs buffer layer 12, an n type GaAs active layer 13 and an insulation layer 14 of silicon dioxide.

In the FET of FIG. 5, the mesa type active region of the FET is divided into two portions, that is a portion 1a including the gate portions 401, 402, 403 and 404 and a portion 1b including the gate portions 405, 406, 407 and 408. In the space between these portions 1a and 1b, a gate bonding pad portion 41 is situated.

The FET fabrication of the present invention is as follows.

A semi-insulating GaAs buffer layer 12 and an n type GaAs epitaxial layer are sequentially grown onto a 400 μm-thick semi-insulating <100> oriented GaAs substrate by an AsCl$_3$-Ga-N$_2$ system. The desired thickness of the n type active layer is obtained by a chemical etching process.

The n type layer out side the active regions of the FET is etched down to the semi-insulating buffer layer 12 to isolate plural mesas (1a, 1b) from each other.

A 0.05 μm thick Au-Ge and a 0.4 μm thick Au film are sequentially deposited on the wafer, and interdigital source and drain electrode 2, 3 having finger portions are defined using conventional photolithography. These contacts are sintered at 450° C. for 120 seconds in an $N_2$ atmosphere to get ohmic contact.

A 0.4 μm thick insulation layer 14 of silicon dioxide is deposited by a chemical vapor deposition (CVD) of $SiH_4$ and $O_2$ and etched selectively to open only gate windows on the mesa active regions (1a, 1b). The insulation layer 14 plays four important roles in the FET. Firstly, it seves as the insulating material between the overlaid gate electrode and source finger portions at the crossover portions. Secondly, it makes the windows determine the gate length automatically. Thirdly, it prevents the source and drain electrode from touching the gate electrode due to misalignment. Lastly, it serves as a passivating material to protect the GaAs surface and source and drain finger portion from various chemical etchants, mechanical scratches and gold-tin solder during successive processes of the FET fabrication.

A 0.5 μm thick Al film is deposited on the $SiO_2$ film, and etched to make gate electrode 4 having portions 401, 402, 403, 404, 405, 406, 407 and 408 and a gate bonding pad portion 41 which is situated in the space formed between a pair of adjacent active regions (1a, 1b).

Finally, source contact portion 21 and drain contact portion 31 are opened by selective etching of the insulation layer 14.

Figure 1:
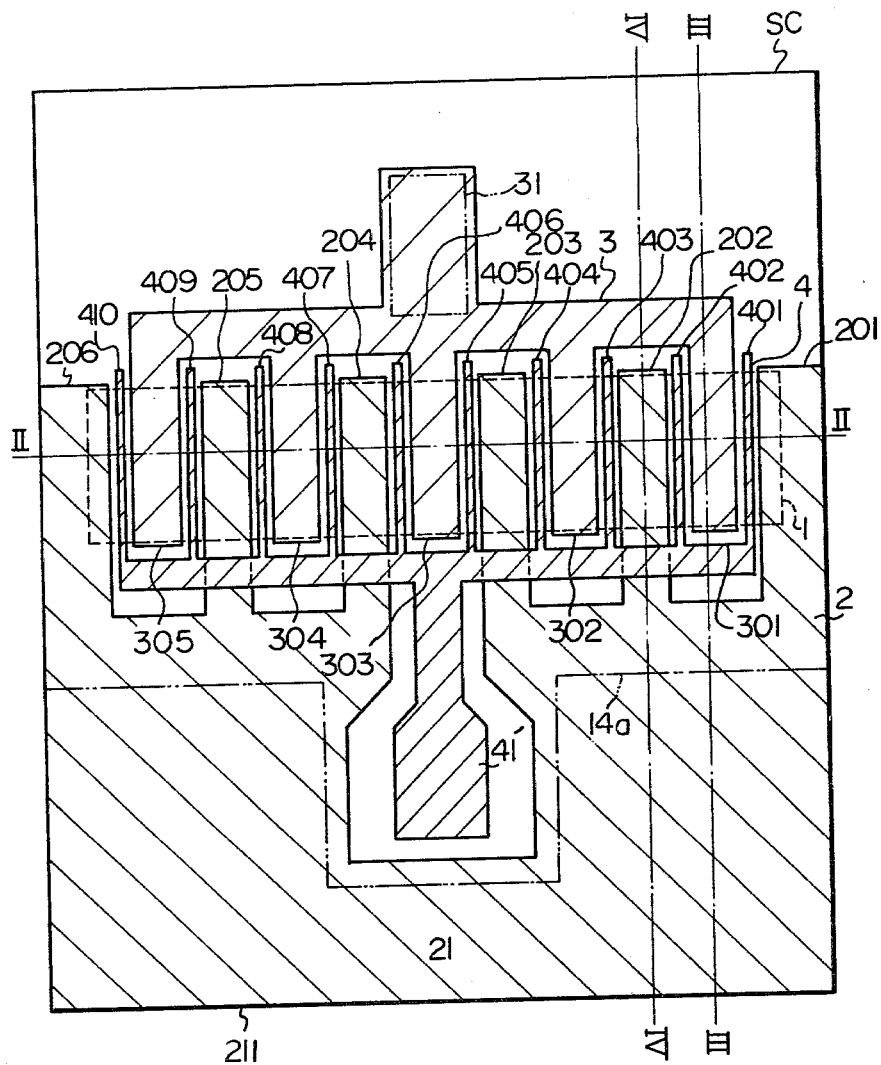
FIG. 1 is a plan view of a prior art FET.
Figure 2:
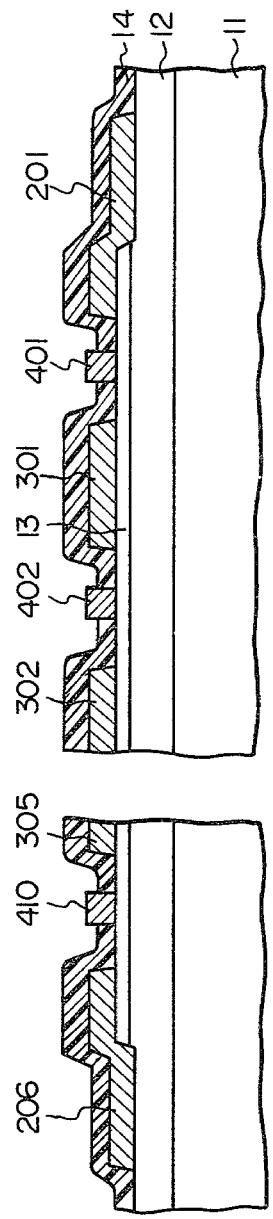
FIG. 2 is a cross-sectional view taken along a line II—II of FIG. 1.
Figure 3:
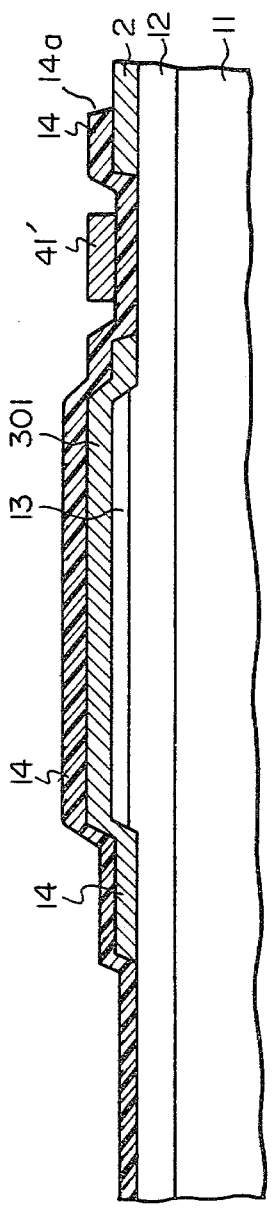
FIG. 3 is a cross-sectional view taken along a line III—III of FIG. 1.
Figure 4:
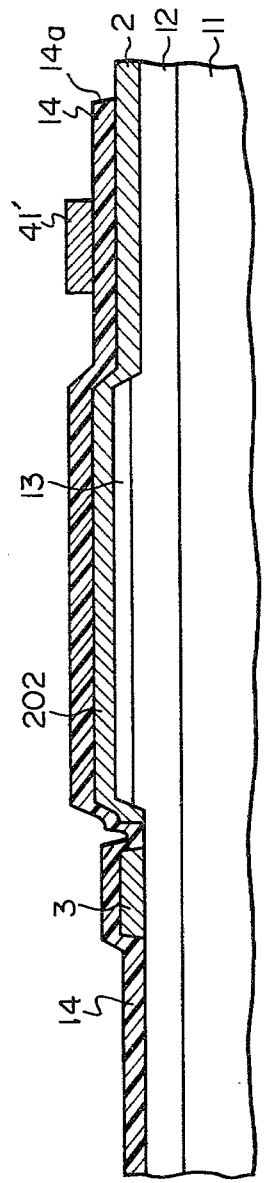
FIG. 4 is a cross-sectional view taken along a line IV—IV of FIG. 1.

Different from the gate bonding pad portion 41' in the arrangement of FIG. 1, the gate bonding pad portion 41 in the arrangement of FIG. 5 does not project outwardly from the interdigital portion of the electrodes. This causes a reduction in the distance between the end portion 211 of the source electrode and the active portions 1a, 1b of the FET. Said distance can be reduced down to approximately 70 μm. Thus, in the FET of FIG. 5 the source inductance is reduced to 20 pH, and accordingly a maximum available gain of at least 3 dB in 8 GHz is obtained with the total gate width of 20 mm. Therefore the maximum available gain of the FET of FIG. 5 is higher by at least 2 dB than that of FIG. 1.

Although the bonding pad portion 31 of the drain electrode and the bonding pad portion 41 of the gate electrode are adjacently located, a source portion 203 of the source electrode which intervenes between the drain electrode and the gate electrode prevents the leakage of high frequency signals between input and output circuits so that no oscillation takes place.

Figure 7:
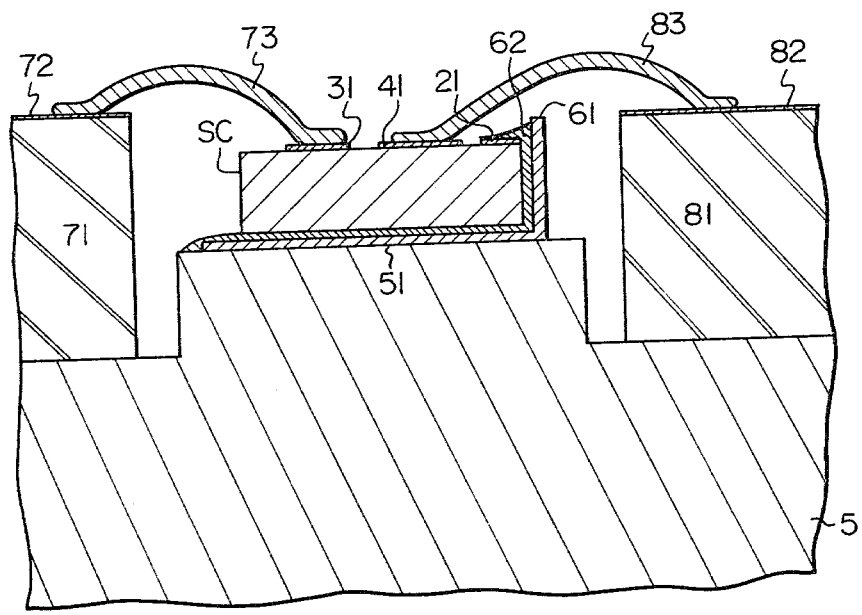
FIG. 7 is a cross-sectional view of the grounding structure of the FET of FIG. 5.
Figure 8:
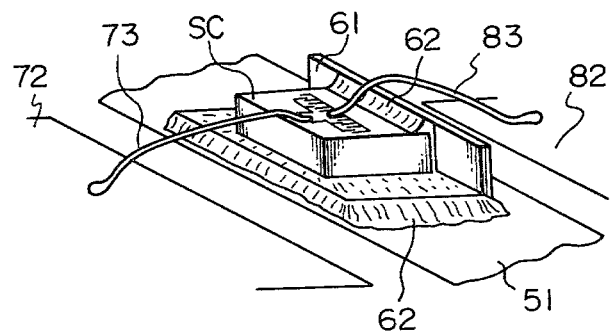
FIG. 8 is a perspective view of the structure of FIG. 7.

Electrical connections and ground arrangements of the semiconductor chip SC of FIG. 5 are illustrated in FIG. 7 as a cross-sectional view and in FIG. 8 as a perspective view. The source electrode 21 is connected by gold-tin solder 62 to an L-shaped sheet 61 made of a conductive material, such as gold, which is fixed to the surface 51 of a body 5 in the earth. The drain bonding pad portion 31 is connected through a drain wire 73 to a conductive layer 72 on a ceramic body 71, and the gate bonding pad portion 41 is connected through a gate wire 83 to a conductive layer 82 on a ceramic body 81.

It should be noted that the present invention is not limited to the above mentioned embodiment but various modifications are possible. For example, a metal insulated gate FET and a FET fabricated on the silicon on sapphire substrate can be used.

What is claimed is:

1. A transistor device having interdigital electrodes on a surface of a semiconductor body, said device comprising an insulating substrate, a plurality of active semiconductor regions placed on said insulating substrate, source and drain electrodes placed on said plurality of active semiconductor regions, said source and drain electrodes being interconnected at the opposite ends with contact pad areas, respectively, and gate electrodes placed between said source and drain electrodes and connected together with a gate contact pad area, said gate contact pad area being placed between a pair of adjacent ones of said active semiconductor regions.

2. The device of claim 1, comprising a portion of said source electrode intervening between said drain electrode and said gate contact pad area.

3. The device of claim 1, said source electrode providing said device with source electrode inductance of as low as 20 pH.

4. The device of claim 3 with a maximum available gain of at least 3 dB at 8 GHz.

5. The device of claim 3 or 4, said device being operable in the range from 3 to 18 GHz as a result of said low inductance electrode.

* * * * *

UNITED STATES PATENT AND TRADEMARK OFFICE
CERTIFICATE OF CORRECTION

PATENT NO. : 4,298,879
DATED : 3 November 1981
INVENTOR(S) : YUTAKA HIRANO

It is certified that error appears in the above—identified patent and that said Letters Patent is hereby corrected as shown below:

```
Col. 1, line 24, "cross sections" should be --cross-sections--;
        line 29, "n type" should be --n-type--;
        line 38, "et al," should be --et al.--;
        line 44, "above" should be --above---;
        line 62, "valve" should be --value--.
Col. 2, line 63, "n type" should be --n-type--;
        line 67, "n type" should be --n-type--.
Col. 3, line 1, "n type" should be --n-type--; "out side"
        should be --outside--;
        line 15, "seves" should be --serves--.
Col. 4, line 17, "above mentioned" should be
        --above-mentioned--;
        line 19, after "and" change "a" to --an--.
```

Signed and Sealed this

Sixteenth Day of February 1982

[SEAL]

Attest:

GERALD J. MOSSINGHOFF

*Attesting Officer*    *Commissioner of Patents and Trademarks*